(12) United States Patent
Shimizu

(10) Patent No.: US 12,462,951 B2
(45) Date of Patent: Nov. 4, 2025

(54) SHIELDING MEMBER AND WIRE HARNESS

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventor: Takeshi Shimizu, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 116 days.

(21) Appl. No.: 18/287,495

(22) PCT Filed: Mar. 18, 2022

(86) PCT No.: PCT/JP2022/012514
§ 371 (c)(1),
(2) Date: Oct. 19, 2023

(87) PCT Pub. No.: WO2022/234730
PCT Pub. Date: Nov. 10, 2022

(65) Prior Publication Data
US 2024/0212881 A1    Jun. 27, 2024

(30) Foreign Application Priority Data
May 6, 2021    (JP) .................................. 2021-078333

(51) Int. Cl.
*H01B 5/12*     (2006.01)
*H01B 7/00*     (2006.01)
(Continued)

(52) U.S. Cl.
CPC ........... *H01B 7/225* (2013.01); *H01B 7/0045* (2013.01); *H01B 7/183* (2013.01); *H01B 7/20* (2013.01)

(58) Field of Classification Search
CPC ........ H01B 5/12; H01B 11/06; H01B 11/1033
(Continued)

(56) References Cited

U.S. PATENT DOCUMENTS

| | | | | | |
|---|---|---|---|---|---|
| 3,582,537 | A | * | 6/1971 | Perreault ................ | H01B 7/083 |
| | | | | | 174/117 M |
| 4,956,524 | A | * | 9/1990 | Karkow ................ | H01B 7/083 |
| | | | | | 174/117 M |

(Continued)

FOREIGN PATENT DOCUMENTS

| | | |
|---|---|---|
| JP | H04-092315 A | 3/1992 |
| JP | 2015-153451 A | 8/2015 |

(Continued)

OTHER PUBLICATIONS

Jun. 14, 2022 International Search Report issued in International Patent Application No. PCT/JP2022/012514.

*Primary Examiner* — Chau N Nguyen
(74) *Attorney, Agent, or Firm* — Oliff PLC

(57) ABSTRACT

A shield including: a plurality of insulating filaments that extend in an X direction; and a plurality of conductive filaments that extend in a Y direction intersecting the X direction and are interknitted with the plurality of insulating filaments, wherein the plurality of insulating filaments includes: a first pair of insulating filaments that are adjacent to each other in the Y direction at a first interval, and a second pair of insulating filaments that are adjacent to each other in the Y direction at a second interval that is larger than the first interval.

6 Claims, 3 Drawing Sheets

(51) Int. Cl.
    *H01B 7/18*           (2006.01)
    *H01B 7/22*           (2006.01)
    *H01B 11/06*         (2006.01)
    *H01B 7/20*           (2006.01)

(58) Field of Classification Search
    USPC ............................................. 174/36, 117 M
    See application file for complete search history.

(56)                  References Cited

U.S. PATENT DOCUMENTS

| | | | |
|---|---|---|---|
| 5,102,727 A * | 4/1992 | Pittman | D03D 15/49 |
| | | | 442/187 |
| 2013/0206275 A1 | 8/2013 | Itoh | |
| 2014/0262478 A1 | 9/2014 | Harris et al. | |
| 2015/0083482 A1 | 3/2015 | Eshima et al. | |
| 2019/0299885 A1 | 10/2019 | Hagi | |
| 2021/0136962 A1 * | 5/2021 | Cho | H05K 9/009 |

FOREIGN PATENT DOCUMENTS

| | | | |
|---|---|---|---|
| JP | 2016-207760 A | | 12/2016 |
| JP | 6156173 | * | 6/2017 |

\* cited by examiner

SHIELDING MEMBER AND WIRE HARNESS

BACKGROUND

The present disclosure relates to a shielding member and a wire harness.

JP 2016-207760A discloses a tubular shielding sleeve made of a fabric. The fabric is composed of the warp and the weft. The warp is composed of a metallic wire and a non-conductive thread. The weft is composed of a supporting thread made of a thermoplastic resin monofilament, and a conductive thread made of polymer material fibers that at least continuously include a metallic layer.

SUMMARY

In the case of a shielding member (shielding sleeve) as disclosed in JP 2016-207760A that includes insulating filaments (non-conductive threads), there is concern that it is difficult to bring the conductive filaments into contact with a connection partner due to the insulating filaments being provided, which leads to unstable electrical connection.

Accordingly, an exemplary aspect of the disclosure provides a technology that can improve the stability of electrical connection of a shielding member to a connection partner.

A shielding member of the present disclosure is a shield including: a plurality of insulating filaments that extend in an X direction; and a plurality of conductive filaments that extend in a Y direction intersecting the X direction and are interknitted with the plurality of insulating filaments, wherein the plurality of insulating filaments includes: a first pair of insulating filaments that are adjacent to each other in the Y direction at a first interval, and a second pair of insulating filaments that are adjacent to each other in the Y direction at a second interval that is larger than the first interval.

A wire harness of the present disclosure is a wire harness including: an electric wire; a shield having a tubular shape that covers an outer circumference of the electric wire; a tube that has an outer circumferential surface to which the shield is electrically connected; and a fixing member that fixes the shield to the tube, wherein: the shield includes: a plurality of insulating filaments that extend in an X direction; and a plurality of conductive filaments that extend in a Y direction intersecting the X direction and are interknitted with the plurality of insulating filaments, the plurality of insulating filaments includes: a first pair of insulating filaments that are adjacent to each other in the Y direction at a first interval; and a second pair of insulating filaments that are adjacent to each other in the Y direction at a second interval that is larger than the first interval, and the fixing member is disposed at a position corresponding to the second interval.

With the present disclosure, it is possible to improve the stability of electrical connection of a shielding member to a connection partner.

DETAILED DESCRIPTION OF EMBODIMENTS

Figure 1:
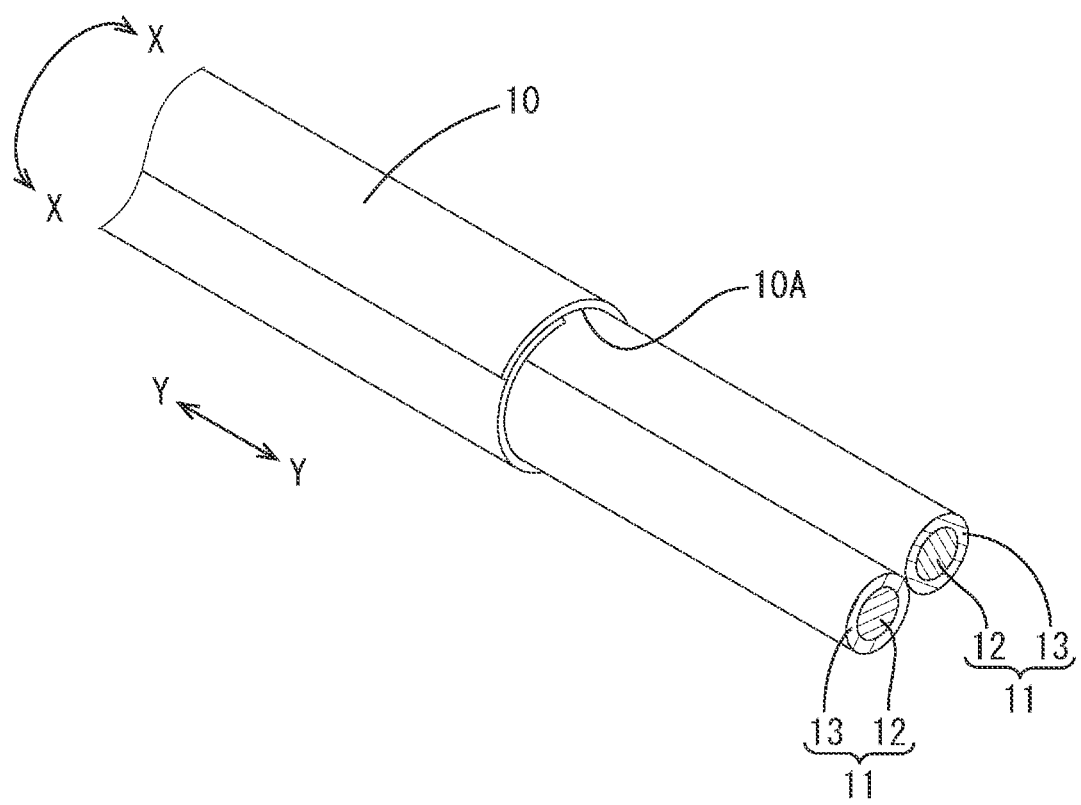
FIG. 1 is a perspective view showing a state in which a shielding member of Embodiment 1 covers the outer circumferences of electric wires.

Description of Embodiments of the Present Disclosure

First, aspects of the present disclosure will be listed and described.

A shielding member of the present disclosure is (1) a shielding member including: a plurality of insulating filaments that extend in an X direction; and a plurality of conductive filaments that extend in a Y direction intersecting the X direction and are interknitted with the insulating filaments, wherein the plurality of insulating filaments include a first pair of the insulating filaments that are adjacent to each other in the Y direction at a first interval, and a second pair of the insulating filaments that are adjacent to each other in the Y direction at a second interval that is larger than the first interval.

With this configuration, when the shielding member is fixed to a connection partner using a fixing member, the conductive filaments of the shielding member can be pressed against the connection partner by disposing the fixing member at a position corresponding to the second interval. As a result, it is possible to improve the stability of electrical connection of the shielding member to the connection partner.

A wire harness of the present disclosure is (2) a wire harness including: an electric wire; a shielding member having a tubular shape that covers an outer circumference of the electric wire; a tubular member that has an outer circumferential surface to which the shielding member is electrically connected; and a fixing member that fixes the shielding member to the tubular member, wherein the shielding member includes: a plurality of insulating filaments that extend in an X direction, and a plurality of conductive filaments that extend in a Y direction intersecting the X direction and are interknitted with the insulating filaments, the plurality of insulating filaments include a first pair of the insulating filaments that are adjacent to each other in the Y direction at a first interval, and a second pair of the insulating filaments that are adjacent to each other in the Y direction at a second interval that is larger than the first interval, and the fixing member is disposed at a position corresponding to the second interval.

With this configuration, the fixing member is disposed at the position corresponding to the second interval, thus making it possible to press the conductive filaments of the shielding member against the outer circumferential surface of the tubular member. As a result, it is possible to improve the stability of electrical connection of the shielding member to the tubular member.

(3) It is preferable that the second interval is larger than a width in the Y direction of the fixing member.

With this configuration, the fixing member can be placed between the two insulating filaments adjacent to each other at the second interval.

(4) It is preferable that the fixing member is provided at a position that is away from both of the two insulating filaments adjacent to each other at the second interval.

With this configuration, the fixing member does not interfere with the insulating filaments, thus making it possible to more firmly press the conductive filaments of the shielding member against the tubular member.

(5) It is preferable that the first interval is smaller than a width in the Y direction of the fixing member.

With this configuration, the fixing member can more firmly press the conductive filaments of the shielding member against the tubular member in the second interval, and the rigidity of the shielding member can be improved in the first interval.

(6) It is preferable that the plurality of insulating filaments include a third pair of the insulating filaments that are adjacent to each other in the Y direction at a third interval that is smaller than the first interval.

With this configuration, a portion that is even more rigid than the portion in the first interval can be set in the shielding member.

(7) It is preferable that the shielding member has a flexible portion and a rigid portion that is more rigid than the flexible portion, the flexible portion includes the second pair, and the rigid portion includes at least one pair of the first pair and the third pair.

With this configuration, a region where the density of the insulating filaments is low and a region where the density of the insulating filaments is high can be formed by adjusting the installation interval between the insulating filaments, and thus the flexible portion and the rigid portion can be formed at required positions of the wire harness. An example of the method of adjusting the installation interval between the insulating filaments is a method of omitting a part of the insulating filaments.

Details of Embodiments of the Present Disclosure

The following describes specific embodiments of the present disclosure will be described with reference to the drawings. Note that the present disclosure is not limited to these examples, but rather is indicated by the scope of the claims, and is intended to include all modifications within the scope and meaning equivalent to the scope of the claims.

Embodiment 1

FIG. 1 discloses a state in which a shielding member 10 (shield) covers the outer circumferences of electric wires 11. Each of the electric wires 11 includes a core wire 12 and a coating 13. The core wire 12 has electric conductivity. The coating 13 has insulating properties and covers the outer circumference of the core wire 12.

Figure 2:
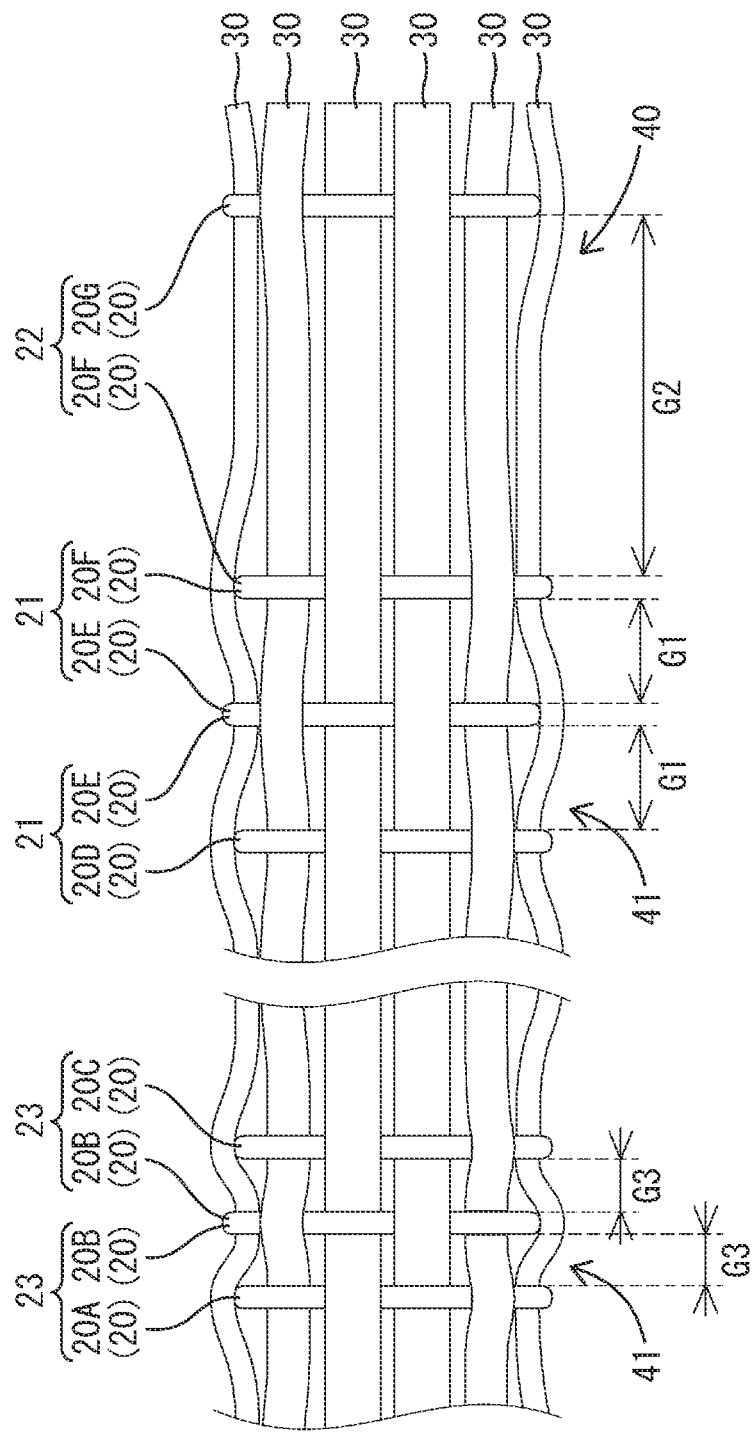
FIG. 2 is a side view of the shielding member.

The shielding member 10 has a tubular shape, more specifically, a cylindrical shape. As shown in FIG. 2, the shielding member 10 includes a plurality of insulating filaments 20 and a plurality of conductive filaments 30. The insulating filaments 20 and the conductive filaments 30 are interknitted with each other into a wavy shape. The insulating filaments 20 are used as the weft, and the conductive filaments 30 are used as the warp.

As shown in FIG. 2, the plurality of insulating filaments 20 extend in an X direction and are disposed side by side in a Y direction. In this embodiment, the X direction corresponds to the circumferential direction of the shielding member 10, and the Y direction corresponds to the direction in which the shielding member 10 extends. It is sufficient that the X direction and the Y direction intersect each other. Moreover, a direction that is orthogonal to both the X direction and the Y direction is taken as a Z direction. In this embodiment, the Z direction corresponds to the radial direction of the shielding member 10. The entire insulating filament 20 is made of a resin. Although there is no limitation on the type of resin, an example of the resin is polyethylene terephthalate. The insulating filament 20 is a bundle of a plurality of resin strands. Each of the resin strands has a circular lateral cross section.

As shown in FIG. 2, the plurality of conductive filaments 30 extend in the Y direction and are disposed side by side in the X direction. The lateral cross-sectional shape of each conductive filament 30 has a width WC larger than an interval GC between the conductive filaments 30 adjacent to each other in the X direction. The width WC is the maximum width in the X direction of the conductive filament 30. The interval GC is the minimum interval between the conductive filaments 30. The conductive filament 30 is a metallic wire, and is constituted by a bundle of a plurality of metallic strands. Each of the metallic strand is, for example, a tinned copper wire. The metallic strand has a circular lateral cross section. Although the diameter of the metallic strand is smaller than the diameter of the resin strand in this embodiment, the diameter of the metallic strand may be the same as or larger than the diameter of the resin strand.

The plurality of insulating filaments 20 include a first pair 21 of the insulating filaments 20 that are adjacent to each other in the Y direction at a first interval G1, a second pair 22 of the insulating filaments 20 that are adjacent to each other in the Y direction at a second interval G2 that is larger than the first interval G1, and a pair of the insulating filaments 20 that are adjacent to each other in the Y direction at a third interval G3 that is smaller than the first interval G1. The plurality of insulating filaments 20 include insulating filaments 20A, 20B, 20C, 20D, 20E, 20F, and 20G. In the example shown in FIG. 2, a pair of the insulating filament 20D and the insulating filament 20E and a pair of the insulating filament 20E and the insulating filament 20F correspond to the first pair 21 of the insulating filaments 20 that are adjacent to each other in the Y direction at the first interval G1. A pair of the insulating filament 20F and the insulating filament 20G corresponds to the second pair 22 of the insulating filaments 20 that are adjacent to each other in the Y direction at the second interval G2. A pair of the insulating filament 20A and the insulating filament 20B and a pair of the insulating filament 20B and the insulating filament 20C correspond to a third pair 23 of the insulating filaments 20 that are adjacent to each other in the Y direction at the third interval G3.

There are a plurality of first intervals G1 and a plurality of third intervals G3 in the Y direction. The insulating filament 20E located between the adjacent first intervals G1 is shared. The insulating filament 20B located between the adjacent third intervals G3 is shared. The second interval G2 is located in at least one of two end portions of the shielding member 10.

The shielding member 10 is formed by, for example, shaping, into a tube, a sheet-like member obtained by interknitting the insulating filaments 20 with the conductive filaments 30. A method of keeping the shielding member 10 in a tubular shape may be, for example, a method in which a thermoplastic resin monofilament is used as the insulating filament 20 as in JP 2016-207760A, and the sheet-like member is shaped into a tube and is then appropriately heated so as to keep its shape. Another method in which one end and the other end in the circumferential direction of the sheet-like member is adhered to each other via an adhesive layer as in JP 2008-147476A may also be used. The shielding member 10 covers the outer circumferences of a plurality of the electric wires 11 as shown in FIG. 1.

Figure 3:
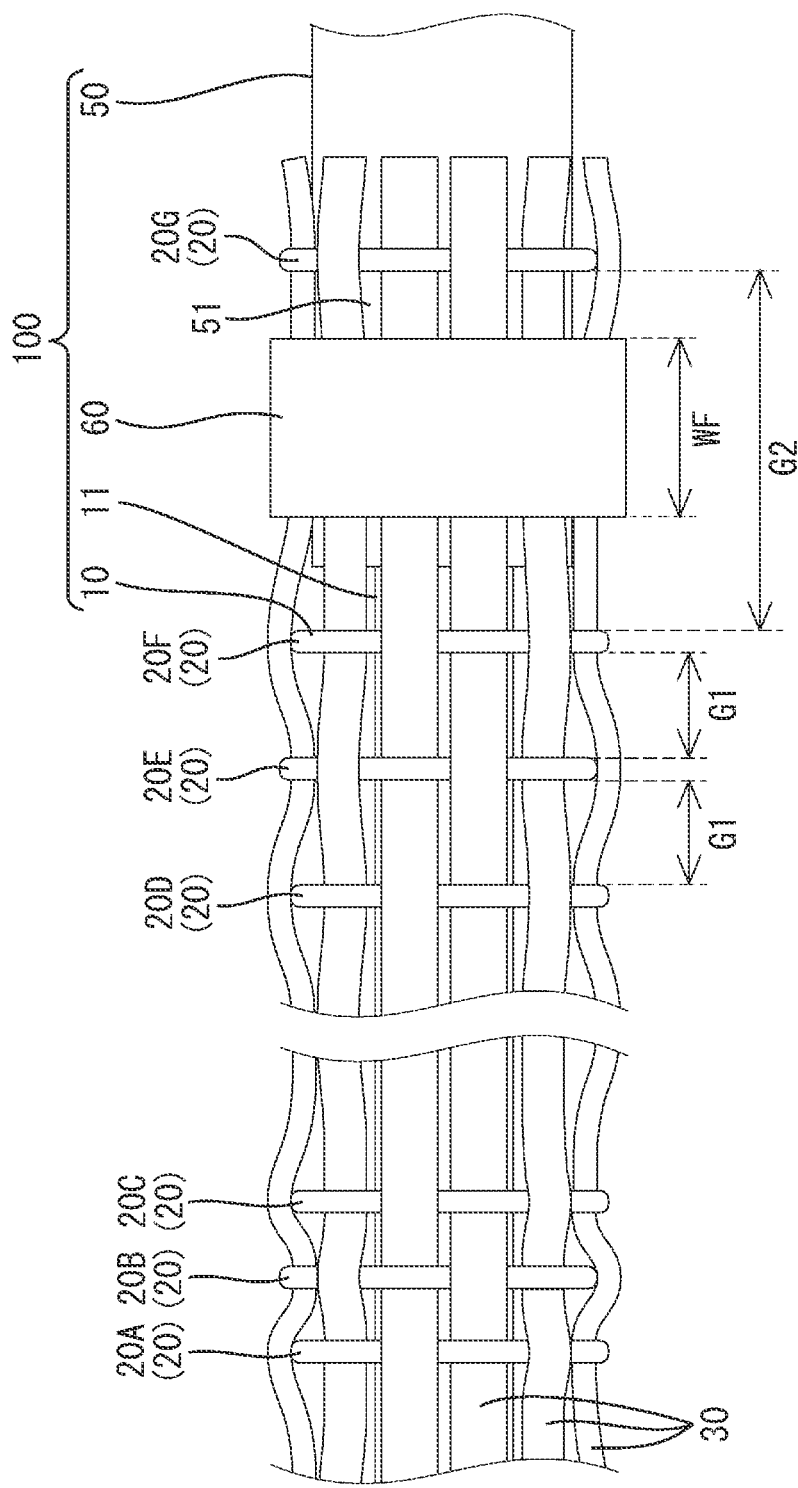
FIG. 3 is a side view of a wire harness.

A wire harness 100 shown in FIG. 3 includes the shielding member 10 and the electric wires 11 described above. The wire harness 100 further includes a tubular member 50

(tube) and a fixing member 60. The tubular member 50 corresponds to a connection partner of the shielding member 10. The tubular member 50 is made of a metal. The tubular member 50 has a cylindrical shape. The tubular member 50 has an outer circumferential surface 51 to which the shielding member 10 is electrically connected. The fixing member 60 is, for example, a crimp ring. The fixing member 60 is made of a metal and has a cylindrical shape. A width WF in the Y direction of the fixing member 60 is larger than the first interval G1 and smaller than the second interval G2.

The shielding member 10 is disposed on the outer circumferential side of the tubular member 50 and fixed using the fixing member 60. The fixing member 60 is crimped on the outer circumferential side of the shielding member 10. The fixing member 60 is crimped at a position that corresponds to the second interval G2 and that is away from both of the two insulating filaments 20 adjacent to each other at the second interval G2.

With this configuration, the fixing member 60 is disposed at the position corresponding to the second interval G2, thus making it possible to press the conductive filaments 30 of the shielding member 10 against the outer circumferential surface 51 of the tubular member 50. As a result, it is possible to improve the stability of electrical connection of the shielding member 10 to the tubular member 50.

Furthermore, with the configuration above, the second interval G2 is larger than the width WF in the Y direction of the fixing member 60, thus making it possible to place the fixing member 60 between the two insulating filaments 20 adjacent to each other at the second interval G2.

Furthermore, the fixing member 60 is provided at a position that is away from both of the two insulating filaments 20 adjacent to each other at the second interval G2. With this configuration, the fixing member 60 does not interfere with the insulating filaments 20, thus making it possible to more firmly press the conductive filaments 30 of the shielding member 10 against the tubular member 50.

Furthermore, the first interval G1 is smaller than the width WF in the Y direction of the fixing member 60. With this configuration, the fixing member 60 can more firmly press the conductive filaments 30 of the shielding member 10 against the tubular member 50 in the second interval G2, and the rigidity of the shielding member 10 can be improved in the first interval G1.

Furthermore, the plurality of insulating filaments 20 include the third pair 23 of the insulating filaments 20 that are adjacent to each other in the Y direction at the third interval G3 that is smaller than the first interval G1. With this configuration, a portion that is even more rigid than the portion in the first interval G1 can be set in the shielding member 10. For example, in the case where a conductive path that includes the shielding member 10 has a bent portion and a linear portion, it is preferable to provide the first interval G1 at the bent portion and the third interval G3 at the linear portion.

Furthermore, as shown in FIG. 2, the shielding member 10 has a flexible portion 40 and a rigid portion 41 that is more rigid than the flexible portion 40. The rigid portion 41 is provided at a position away from the flexible portion 40 in the Y direction. The flexible portion 40 includes the second pair 22, and the rigid portion 41 includes the first pair 21 and the third pair 23. Accordingly, a region where the density of the insulating filaments 20 is low and a region where the density of the insulating filaments 20 is high can be formed by adjusting the installation interval between the insulating filaments 20, and thus the flexible portion 40 and the rigid portion 41 can be formed at required positions of the wire harness 100. An example of the method of adjusting the installation interval between the insulating filaments 20 is a method of omitting a part of the insulating filaments 20. The flexible portion 40 is provided, for example, at a bent portion of a conductive path that includes the shielding member 10. The rigid portion 41 is provided, for example, at a linear portion of a conductive path that includes the shielding member 10.

Other Embodiments of the Present Disclosure

The embodiments disclosed herein are exemplary in all respects, and should be construed as being not limitative.

(1) Although the shielding member of the embodiment above is formed by shaping a sheet-like member into a tube, the shielding member may also be formed in a tubular shape by interknitting the conductive filaments and the insulating filaments in a tubular shape.

(2) Although the insulating filament of the embodiment above is a resin wire, the insulating filament may also be an insulating filament other than the resin wire.

(3) Although the insulating filament of the embodiment above is a bundle of resin strands, the insulating filament may also be constituted by a single strand.

(4) Although the conductive filament of the embodiment above is a metallic wire, the conductive filament may also be a conductive filament other than the metallic wire.

(5) Although the conductive filament of the embodiment above is a bundle of metallic strands, the conductive filament may also be constituted by a single strand.

(6) Although the shielding member is electrically connected to a connection partner without being folded back in the embodiment above, a configuration may also be employed in which the leading-end side of the shielding member is folded back, and the folded-back portion is electrically connected to a connection partner disposed on the inner circumferential side of the folded-back portion.

(7) Although the fixing member of the embodiment above is a crimp ring made of a metal, the fixing member may also be a resin zip tie.

(8) Although the fixing member of the embodiment above is disposed away from the two insulating filaments adjacent to each other at the second interval, the fixing member may also be in contact with at least one of the two insulating filaments adjacent to each other at the second interval.

(9) Although the rigid portion includes both the first pair and the third pair in the embodiment above, it is sufficient that the rigid portion include at least one of the first pair and the third pair.

The invention claimed is:

1. A wire harness comprising:
an electric wire;
a shield having a tubular shape that covers an outer circumference of the electric wire;
a tube that has an outer circumferential surface to which the shield is electrically connected; and
a fixing member that fixes the shield to the tube, wherein:
the shield includes:
a plurality of insulating filaments that extend in an X direction; and
a plurality of conductive filaments that extend in a Y direction intersecting the X direction and are interknitted with the plurality of insulating filaments, the plurality of insulating filaments includes:
    a first pair of insulating filaments that are adjacent to each other in the Y direction at a first interval; and
    a second pair of insulating filaments that are adjacent to each other in the Y direction at a second interval that is larger than the first interval,
the fixing member is disposed at a position corresponding to the second interval, and
the fixing member is provided at a position that is away from the second pair of insulating filaments adjacent to each other at the second interval.

2. The wire harness according to claim 1, wherein the second interval is larger than a width in the Y direction of the fixing member.

3. The wire harness according to claim 1, wherein the first interval is smaller than a width in the Y direction of the fixing member.

4. The wire harness according to claim 1, wherein the plurality of insulating filaments include a third pair of insulating filaments that are adjacent to each other in the Y direction at a third interval that is smaller than the first interval.

5. The wire harness according to claim 4, wherein:
the shield has a flexible portion and a rigid portion that is more rigid than the flexible portion,
the flexible portion includes the second pair of insulating filaments and
the rigid portion includes at least one pair of the first pair of insulating filaments and the third pair of insulating filaments.

6. A wire harness comprising:
an electric wire;
a shield having a tubular shape that covers an outer circumference of the electric wire;
a tube that has an outer circumferential surface to which the shield is electrically connected; and
a fixing member that fixes the shield to the tube, wherein:
the shield includes:
    a plurality of insulating filaments that extend in an X direction; and
    a plurality of conductive filaments that extend in a Y direction intersecting the X direction and are interknitted with the plurality of insulating filaments,
the plurality of insulating filaments includes:
    a first pair of insulating filaments that are adjacent to each other in the Y direction at a first interval; and
    a second pair of insulating filaments that are adjacent to each other in the Y direction at a second interval that is larger than the first interval,
the fixing member is disposed at a position corresponding to the second interval, and
the plurality of insulating filaments include a third pair of insulating filaments that are adjacent to each other in the Y direction at a third interval that is smaller than the first interval.

* * * * *